US010332873B2

(12) United States Patent
Ishii et al.

(10) Patent No.: US 10,332,873 B2
(45) Date of Patent: Jun. 25, 2019

(54) APPARATUS COMPRISING ANTIFUSE CELLS

(71) Applicant: Micron Technology, Inc., Boise, ID (US)

(72) Inventors: Toshinao Ishii, Tokyo (JP); Yasuhiko Tanuma, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/619,811

(22) Filed: Jun. 12, 2017

(65) Prior Publication Data

US 2018/0358356 A1    Dec. 13, 2018

(51) Int. Cl.
*H01L 23/525* (2006.01)
*H01L 27/06* (2006.01)

(52) U.S. Cl.
CPC ...... *H01L 27/0617* (2013.01); *H01L 23/5252* (2013.01)

(58) Field of Classification Search
CPC ................ H01L 27/0617; H01L 23/5252
See application file for complete search history.

(56) References Cited

U.S. PATENT DOCUMENTS

| 2011/0248356 A1* | 10/2011 | Smith | H01L 27/112 257/390 |
| 2012/0104544 A1* | 5/2012 | Kubota | H01L 23/5252 257/530 |
| 2017/0125427 A1* | 5/2017 | Shum | H01L 27/11206 |

* cited by examiner

*Primary Examiner* — Matthew C Landau
*Assistant Examiner* — Dmitriy Yemelyanov
(74) *Attorney, Agent, or Firm* — Wells St. John P.S.

(57) ABSTRACT

An apparatus comprises an antifuse cell comprising first and second nodes, an antifuse element, and a transistor. The antifuse element and the transistor are coupled in series between the first and second nodes. The antifuse element comprises an antifuse gate. The transistor comprises a transistor gate comprising a substantially-annular structure substantially surrounding the antifuse gate.

4 Claims, 10 Drawing Sheets

APPARATUS COMPRISING ANTIFUSE CELLS

TECHNICAL FIELD

Embodiments disclosed herein pertain to apparatus comprising antifuse cells.

BACKGROUND

Modern integrated circuitry relies on complex manufacturing processes to create such circuitry. Such may ultimately result in defective portions of circuitry, for example such as defective logic circuits, defective memory cells, defective access lines, or defective digit lines. One technique used to account for potential defects is to build in redundant circuitry, for example redundant rows of access lines and redundant columns of digit lines. In some instances, an antifuse cell comprising a transistor and an antifuse element may be used, for example, to provide a programmable electrical coupling connection to a portion of the redundant circuitry by "blowing" the antifuse element. Additionally, antifuse cells comprising a transistor and an antifuse element may be used in other existing or yet-to-be-developed implementations not necessarily associated with redundancy.

One prior art antifuse cell construction 100 is shown and described with reference to FIGS. 1 and 2. Such comprises a pair of antifuse cells 102 electrically coupled together, and that individually comprise an antifuse element 104 and a transistor construction 106. Construction 100 comprises a base substrate comprising dielectric isolation regions 114 and p-type semiconductor material regions P and n-type conductively-doped n-type regions N. Transistor construction 106 comprises a gate 108, gate insulator 110, and n-type source/drain regions 112 and 113. Anti-fuse element 104 comprises a first anti-fuse electrode 120, a second anti-fuse electrode 124, and insulator material 122 there-between in the depicted "unblown" state. Gate 108 electrically couples the two antifuse cells 102 together and each antifuse cell may be separately controlled to "blow" one antifuse and not the other, or to "blow" the antifuses at different times.

Construction 100 is schematically shown as having an interconnect line 130 that connects source/drain region 112 with second anti-fuse electrode 124. A schematic interconnect line 132 connects gates 108 of transistors 106 that are adjacent to each other, left and right in FIG. 1, in an example row direction. Schematic interconnect lines 134 connect source/drain regions 113 of individual transistors 106 together, and such regions of multiple transistors in an example column direction. Schematic interconnect lines 136 connect first anti-fuse electrodes 120 of adjacent anti-fuse cells 104 together in the row direction. Schematic interconnect lines 138 connect interconnect lines 136 together in the row direction. Each of these interconnect lines is fabricated in one or more metal levels above the depicted example level of gate 108 and first anti-fuse electrode 120.

DETAILED DESCRIPTION OF EXAMPLE EMBODIMENTS

A first example apparatus in accordance with an embodiment of the invention is shown in and described with reference to FIGS. 3 and 4. Such includes a substrate structure or construction 8 comprising an antifuse cell 10 that has been fabricated relative to a base substrate 11. Example base substrate 11 may comprise any one or more of conductive/conductor/conducting (i.e., electrically herein), semiconductive/semiconductor/semiconducting, and insulative/insulator/insulating (i.e., electrically herein) materials. Various materials have been formed elevationally over base substrate 11. Materials may be aside, elevationally inward, or elevationally outward of the FIGS. 3 and 4-depicted materials. For example, other partially or wholly fabricated components of integrated circuitry may be provided somewhere above, about, or within base substrate 11. An example base substrate 11 comprises semiconductor material 12 (e.g., lightly doped p-type or n-type semiconductive material such as monocrystalline silicon, with example p-type being indicated with "P") having dielectric isolation regions 14 formed therein (e.g., comprising silicon dioxide and/or silicon nitride) as shallow isolation trenches (STI).

Antifuse cell 10 comprises an antifuse element 16 and a transistor 18 (e.g., a pass transistor that is sometimes abbreviated as a pass gate by people of skill in the art). Antifuse cell 10 may be considered as comprising a first node 20 and a second node 22, with antifuse element 16 and transistor 18 being coupled in series (i.e., electrical) between first node 20 and second node 22. First node 20 may be considered as being a first antifuse electrode 20. Additionally, or alternately, first node 20 may be considered as an antifuse gate 20 or the first node may be considered as being coupled, in one embodiment directly coupled, to antifuse gate 20. Regardless, example materials for component 20 are metal materials and/or conductively-doped semiconductor material such as polysilicon.

Figure 3:
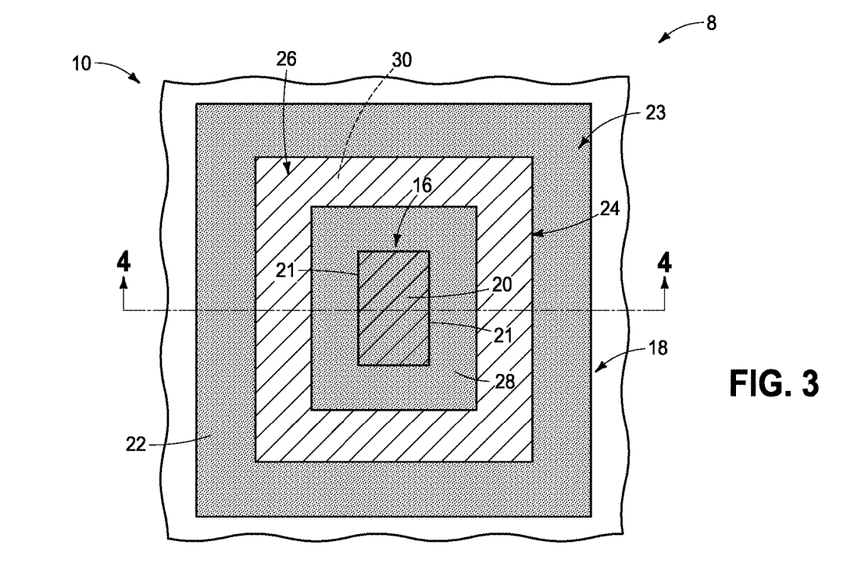
FIG. 3 is a diagrammatic horizontal cross-sectional and downward view of an apparatus in accordance with an embodiment of the invention, and is taken through line 3-3 in FIG. 4.

In one embodiment, transistor 18 comprises a transistor gate 24 (e.g., a pass gate 24 where transistor 18 comprises a pass transistor) comprising a substantially annular (e.g., at least 70% around everywhere herein) structure 26 substantially surrounding (e.g., surrounding at least 70% everywhere herein) antifuse gate 20 (e.g., in straight-line horizontal cross-section, such as the FIG. 3 cross-section). In one embodiment and as shown, substantially-annular structure 26 of transistor gate 24 completely surrounds (i.e., 100%) antifuse gate 20. Transistor gate 24 may be of the same or different composition as that of antifuse gate 20.

Transistor 18 comprises a first diffusion region 28 (e.g., a first source/drain region 28) inside substantially-annular structure 26 of transistor gate 24 and a second diffusion region 22 (e.g., a second source/drain region 22 and/or second node 22) outside substantially-annular structure 26 of transistor gate 24. A channel region 30 is between first source/drain region 28 and second source/drain region 22, with gate 20 being operably proximate channel region 30 (e.g., being directly above channel region 30 with a gate insulator material 32 such as silicon dioxide and/or silicon nitride being between transistor gate 24 and channel region 30). Example regions 22 and 28 are shown as being n-type (e.g., heavily doped to be conductive) by designation with "N" and lightly-doped semiconductor material 12 and channel region 30 are shown as being p-type "P". Such could of course be reversed.

Antifuse element 16 comprises a second antifuse electrode. An insulator material is between the first antifuse electrode and the second antifuse electrode to separate the first and second antifuse electrodes in an "unblown" state of the antifuse element. In one embodiment, first source/drain region 28 comprises a second antifuse electrode 28, and which in one embodiment is common to and shared by antifuse element 16 and transistor 18. An insulator material 34 is between first antifuse electrode 20 and second antifuse electrode 28. Insulator material 34 may, in some embodiments, be of the same composition as gate insulator 32, manufactured at the same time as gate insulator 32, and may be considered as gate insulator material 34. In one embodiment, second antifuse electrode 28 is not substantially annular in any straight-line horizontal cross-section. In one embodiment, at least part of first antifuse electrode 20 overlaps at least part of second antifuse electrode 28 with an intervention of gate insulator material 34, and in one embodiment as shown all of first antifuse electrode overlaps at least a part of second antifuse electrode 28. In one embodiment, second source/drain region 22 is substantially annular in straight-line horizontal cross-section (e.g., the FIG. 3 cross-section) thereby comprising a substantially annular structure 23.

In one embodiment, first antifuse electrode 20 elevationally overlaps second antifuse electrode 28. In one such embodiment, second antifuse electrode 28 extends laterally outward of first antifuse electrode 20, and in one such embodiment extends laterally outward of both sides 21 of first antifuse electrode 20.

Figure 4:
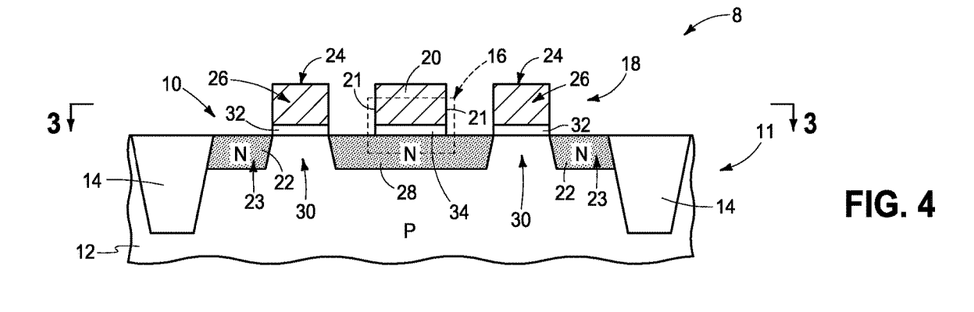
FIG. 4 is a cross-sectional view taken through line 4-4 in FIG. 3.

Any other attribute(s) or aspect(s) as shown and/or described herein with respect to other embodiments may be used in the embodiments of FIGS. 3 and 4.

Figure 5:
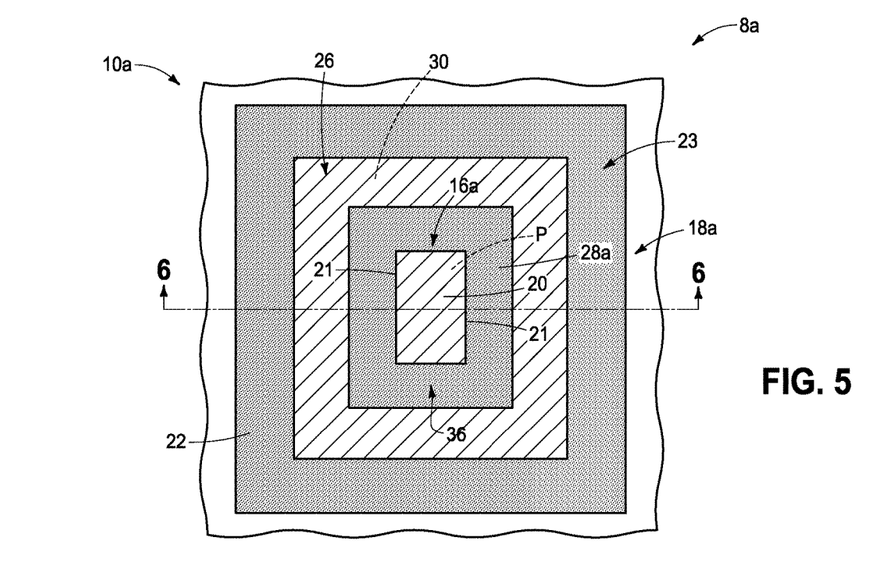
FIG. 5 is a diagrammatic horizontal cross-sectional and downward view of an apparatus in accordance with an embodiment of the invention, and is taken through line 5-5 in FIG. 6.
Figure 6:
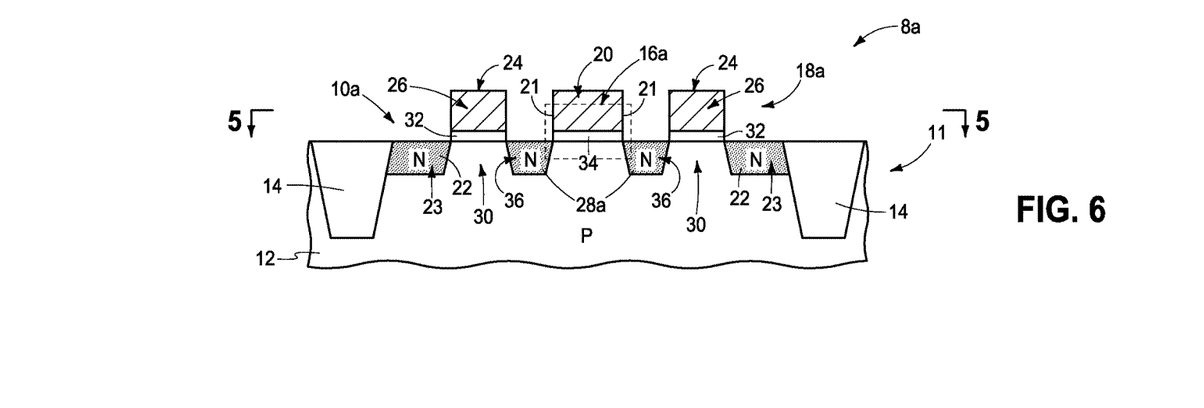
FIG. 6 is a cross-sectional view taken through line 6-6 in FIG. 5.

An alternate embodiment apparatus construction 8a comprising an antifuse cell 10a is described with reference to FIGS. 5 and 6. Like numerals from the above-described embodiments have been used where appropriate, with some construction differences being indicated with the suffix "a" or with different numerals. Second antifuse electrode 28a differs from that described above with respect to FIGS. 3 and 4 in being substantially annular, thereby comprising a substantially-annular structure 36 (e.g., in straight-line horizontal cross-section such as the FIG. 5 cross-section). FIGS. 5 and 6 also show an example embodiment wherein first antifuse electrode 20 does not elevationally overlap second antifuse electrode 28a, and also an embodiment wherein second antifuse electrode 28a is everywhere laterally outward of first antifuse electrode 20. In one embodiment, second antifuse electrode 28a comprises a diffusion region of one of n-type conductivity and p-type conductivity (n-type "N" being shown), with antifuse element 16a also comprising semiconductive material of the other of n-type conductivity and p-type conductivity between first antifuse electrode 20 and second antifuse electrode 28a (e.g., lightly-doped semiconductive material "P" immediately below insulator 34). FIGS. 3 and 4 show an alternate example wherein second antifuse electrode 28 comprises a diffusion region of the one conductivity type, with there being no semiconductive material of the other conductivity type between first antifuse electrode 20 and second antifuse electrode 28. Regardless, any other attribute(s) or aspect(s) as shown and/or described herein with respect to other embodiments may be used.

Figure 7:
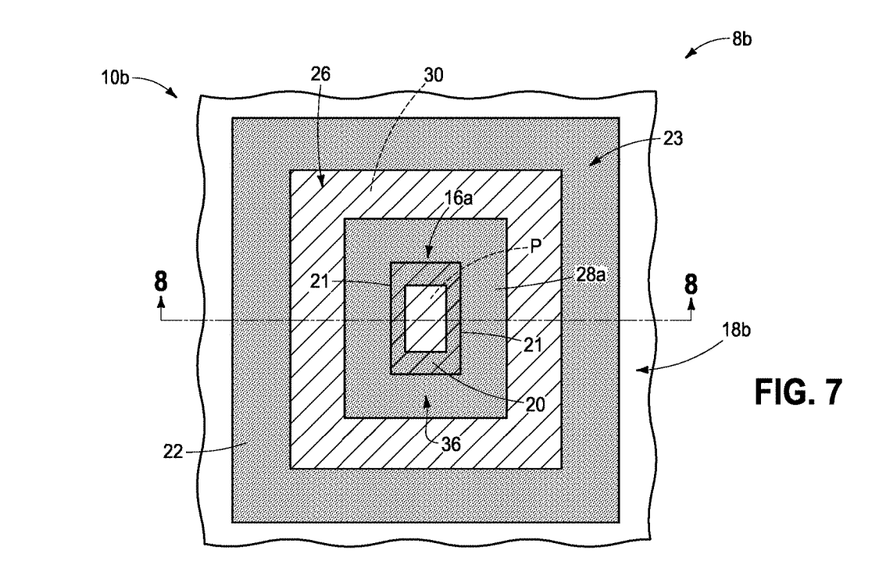
FIG. 7 is a diagrammatic horizontal cross-sectional and downward view of an apparatus in accordance with an embodiment of the invention, and is taken through line 7-7 in FIG. 8.
Figure 8:
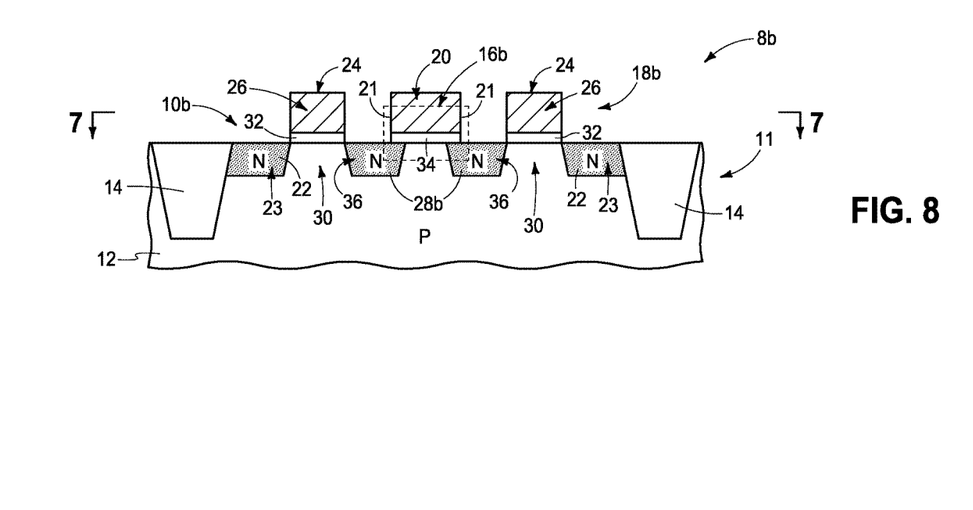
FIG. 8 is a cross-sectional view taken through line 8-8 in FIG. 7.

Another embodiment apparatus construction 8b comprising an antifuse cell 10b is described with reference to FIGS. 7 and 8. Like numerals from the above-described embodiments have been used where appropriate, with some construction differences being indicated with the suffix "b". Antifuse cell 10b is similar to antifuse cell 10a, with a difference being that at least part of first antifuse electrode 20 overlaps at least a part of a substantially-annular second antifuse electrode 28b. Any other attribute(s) or aspect(s) as shown and/or described herein with respect to other embodiments may be used.

Figure 9:
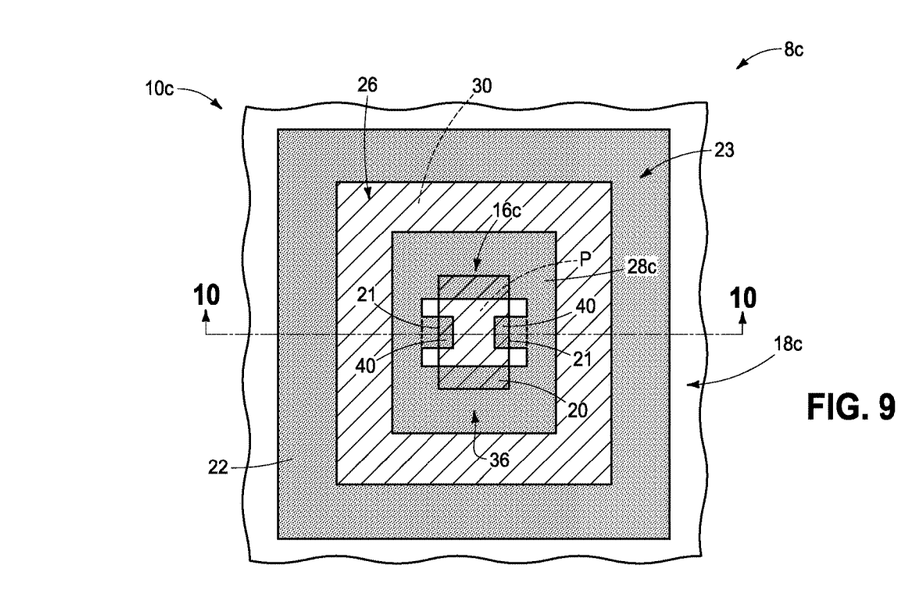
FIG. 9 is a diagrammatic horizontal cross-sectional and downward view of an apparatus in accordance with an embodiment of the invention, and is taken through line 9-9 in FIG. 10.
Figure 10:
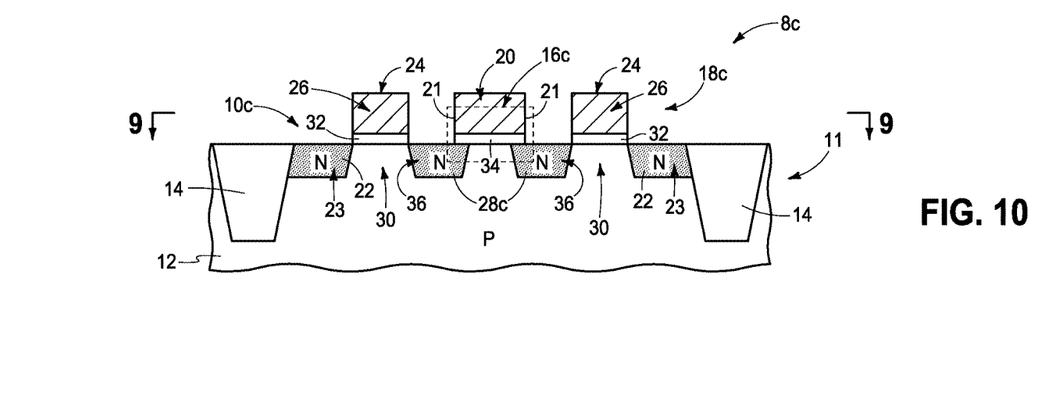
FIG. 10 is a cross-sectional view taken through line 10-10 in FIG. 9.

Another embodiment apparatus construction 8c comprising an antifuse cell 10c is shown and described with reference to FIGS. 9 and 10. Like numerals from the above-described embodiments have been used where appropriate, with some construction differences being indicated with the suffix "c" or with different numerals. Second antifuse electrode 28c is substantially annular and comprises a pair of radially-opposed projections 40 that project radially inward toward one another (FIG. 9). Additionally, at least a part of first antifuse electrode 20 overlaps at least a part of substantially-annular second antifuse electrode 28c with an intervention of insulator material 34. Any other attribute(s) or aspect(s) as shown and/or described herein with respect to other embodiments may be used.

Figure 11:
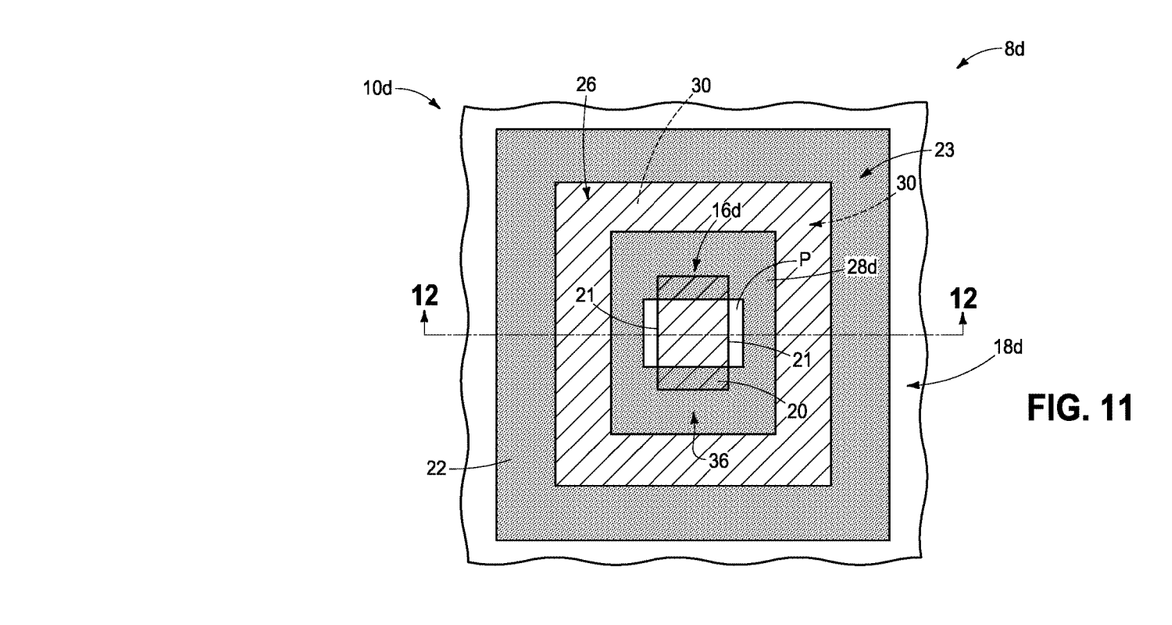
FIG. 11 is a diagrammatic horizontal cross-sectional and downward view of an apparatus in accordance with an embodiment of the invention, and is taken through line 11-11 in FIG. 12.
Figure 12:
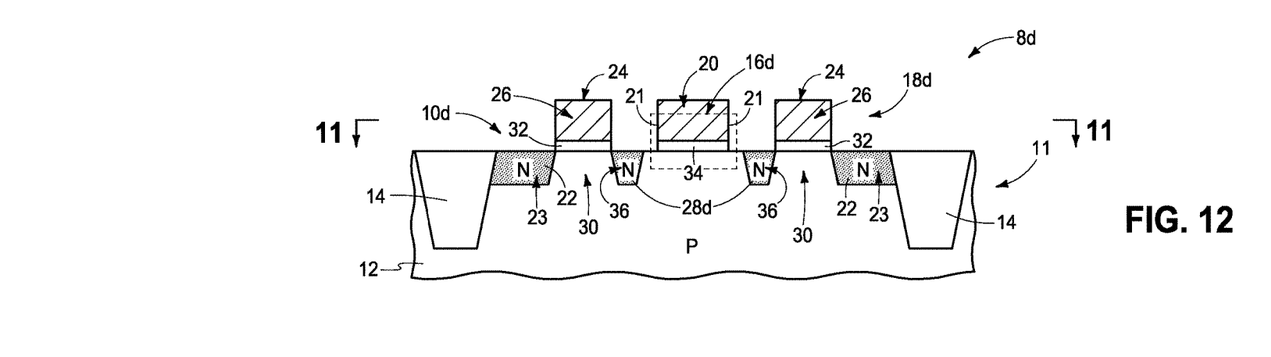
FIG. 12 is a cross-sectional view taken through line 12-12 in FIG. 11.

Another alternate embodiment apparatus construction 8d comprising an antifuse cell 10d is shown and described with reference to FIGS. 11 and 12. Like numerals from the above-described embodiments have been used where appropriate, with some construction differences being indicated with the suffix "d". Antifuse cell 10d comprises substantially-annular second antifuse electrode 28d configured such that no part of first antifuse electrode 20 overlaps any part of substantially-annular second antifuse electrode 28d in at least one straight-line vertical cross-section (e.g., the FIG. 12 cross-section). Any other attribute(s) or aspect(s) as shown and/or described herein with respect to other embodiments may be used.

Another alternate embodiment apparatus construction 8e comprising an antifuse cell 10e is shown and described with reference to FIGS. 13 and 14. Like numerals from the above-described embodiments have been used where appropriate, with some construction differences being indicated with the suffix "e" or with different numerals. Antifuse cell 10e comprises first antifuse gate/electrode 20e and additionally a second antifuse gate 44 (in some embodiments referred to as a third antifuse electrode 44) that is circuit-parallel with first antifuse gate/electrode 20e. In one embodiment, each of first antifuse electrode 20e and third antifuse electrode 44 has an independently controllable control line (not shown) electrically coupled thereto. Such may be used, for example, to enhance the reliability of the "blown" state of antifuse cell 10e. Specifically, to "blow" the antifuse, only one of electrodes 20e and 44 may be supplied first with a sufficiently high voltage to breach insulator 34 thereunder, and thereafter the other of electrode 20e and electrode 44 is supplied with such high voltage. Regardless, in one embodiment, transistor gate 24e, first antifuse electrode 20e, and third antifuse electrode 44 comprise respective portions that are in both a common straight-line vertical cross-section (e.g., the FIG. 14 cross-section) and a common straight-line horizontal cross-section (e.g., the FIG. 13 cross-section). Any other attribute(s) or aspect(s) as shown and/or described herein with respect to other embodiments may be used.

Figure 15:
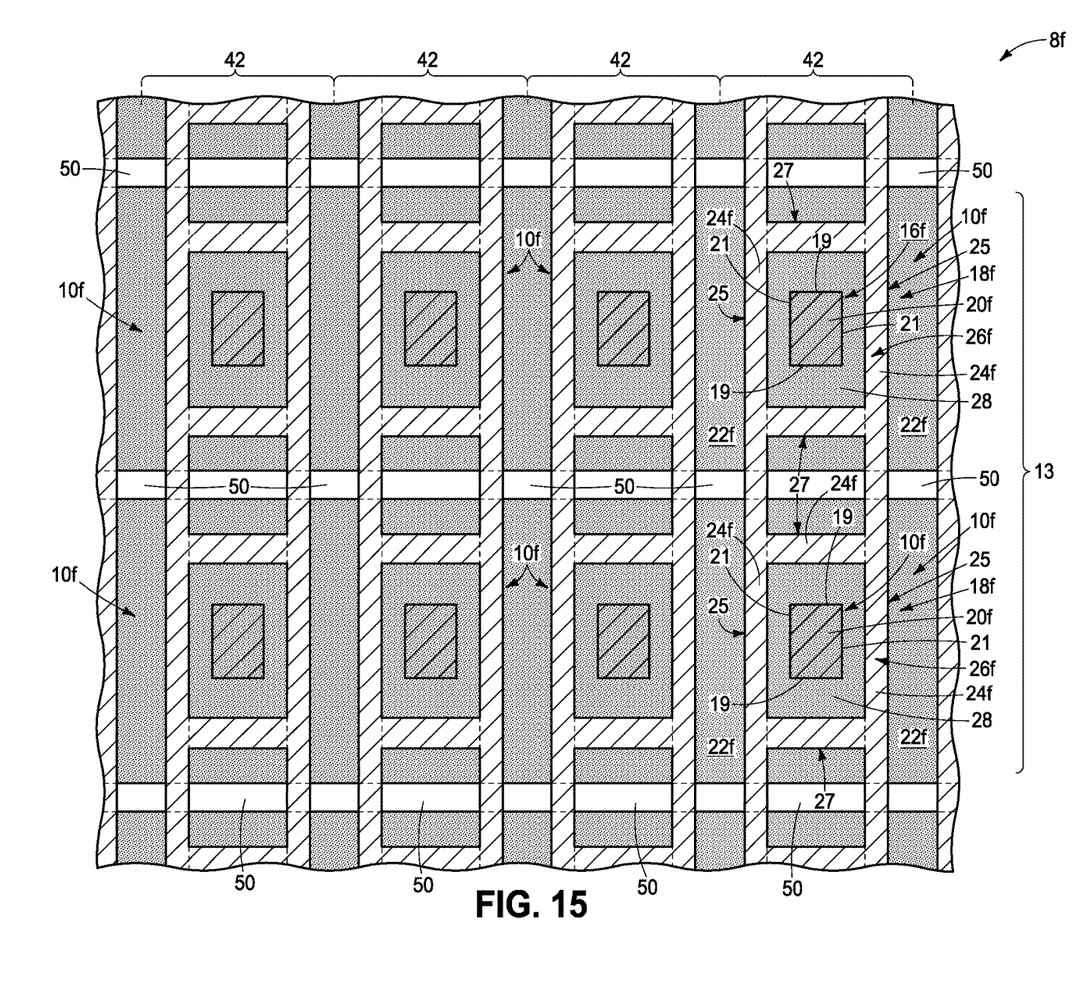
FIG. 15 is a diagrammatic horizontal cross-sectional and downward view of an apparatus in accordance with an embodiment of the invention.

The above example embodiments show example single-depicted antifuse cells. Such may be part of an array comprising many antifuse cells, and with such array perhaps being associated with and laterally adjacent to an array of memory cells (i.e., a memory array). One such example array apparatus construction 8f in accordance with an embodiment of the invention is shown and described with reference to FIG. 15. Like numerals from the above-described embodiments have been used where appropriate, with some construction differences being indicated with the suffix "f" or with different numerals. FIG. 15 depicts a horizontal diagrammatic sectional view analogous and similar to the FIG. 3 view and construction of a single antifuse cell 10 described above. Construction 8f comprises row or column lines 42 of antifuse cells 10f, with an embodiment in accordance with an aspect of the invention comprising an example pair 13 of antifuse cells 10f individually comprising a first node 20f (e.g., an antifuse gate and/or a first antifuse electrode) and a second node 22f. An antifuse element 16f and a transistor 18f comprise a part of individual antifuse cells 10f, with transistor 18f comprising a transistor gate 24f. One or both of second antifuse electrode 28 and second node 22f may be annular in horizontal cross-section. One or both of second antifuse electrode 28 and second node 22f may not be annular in horizontal cross-section.

Transistor gates 24f of pair 13 of antifuse cells 10f comprise a first pair of gate lines 25 running along first opposing sides 21 of individual antifuse gates 20f and between antifuse cells 10f of pair 13 of antifuse cells 10f. First pair of gate lines 25 directly electrically couple the two antifuse cells 10f of pair 13 together. A second pair of gate lines 27 run along second opposing sides 19 of individual antifuse gates 20f and contact each gate line 25 of the first pair gate lines 25. First pair of gate lines 25 and second pair of gate lines 27 form two annular structures 26f that individually completely surround one antifuse gate 20f of pair 13 of antifuse cells 10f. In one embodiment, a trench isolation region 50 is present and elongated orthogonally relative to first pair of gates lines 25, with first pair of gate lines 25 being directly above trench isolation region 50. Any other attribute(s) or aspect(s) as shown and/or described herein with respect to other embodiments may be used.

Figure 16:
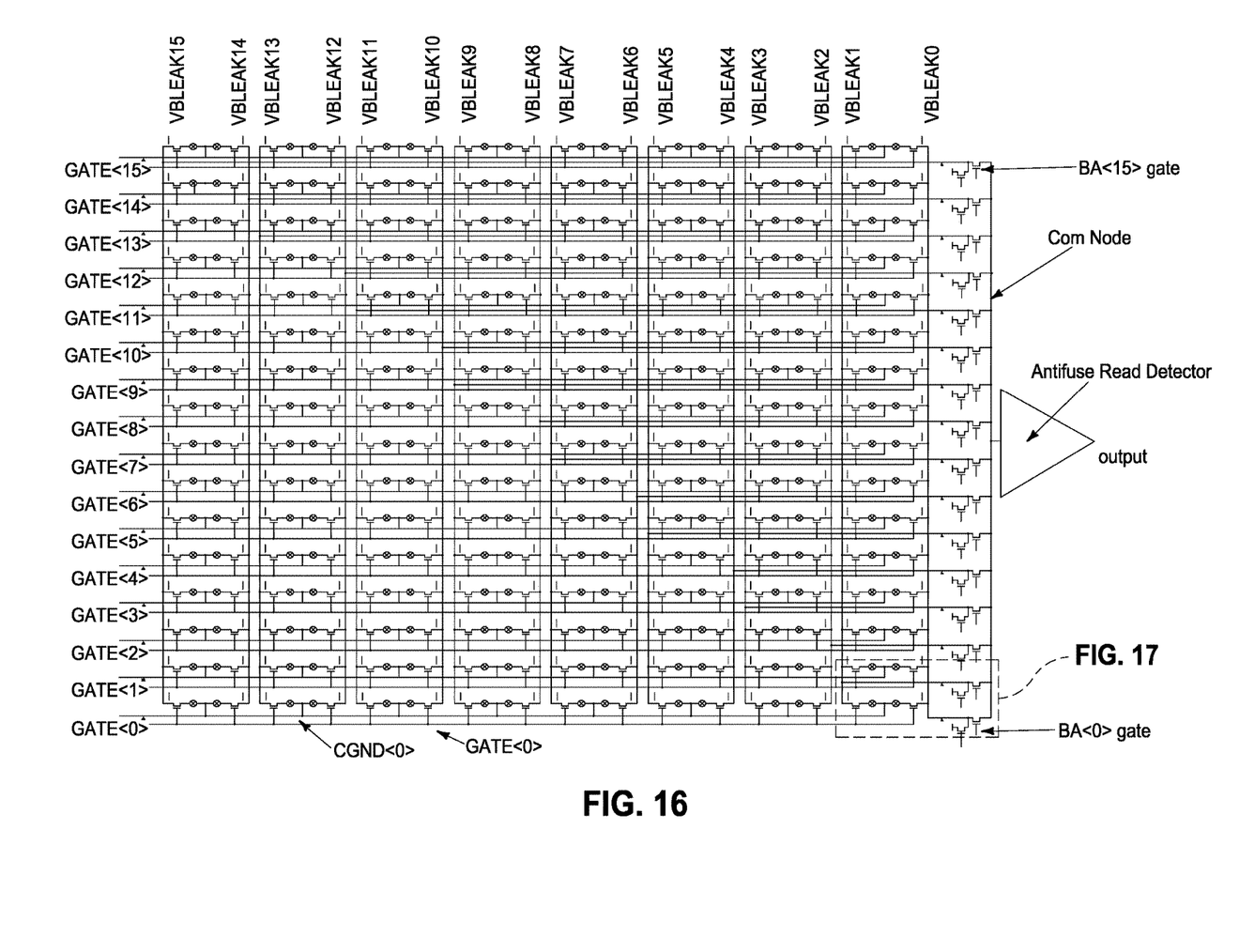
FIG. 16 is a hybrid schematic and construction view of an apparatus in accordance with an embodiment of the invention.
Figure 17:
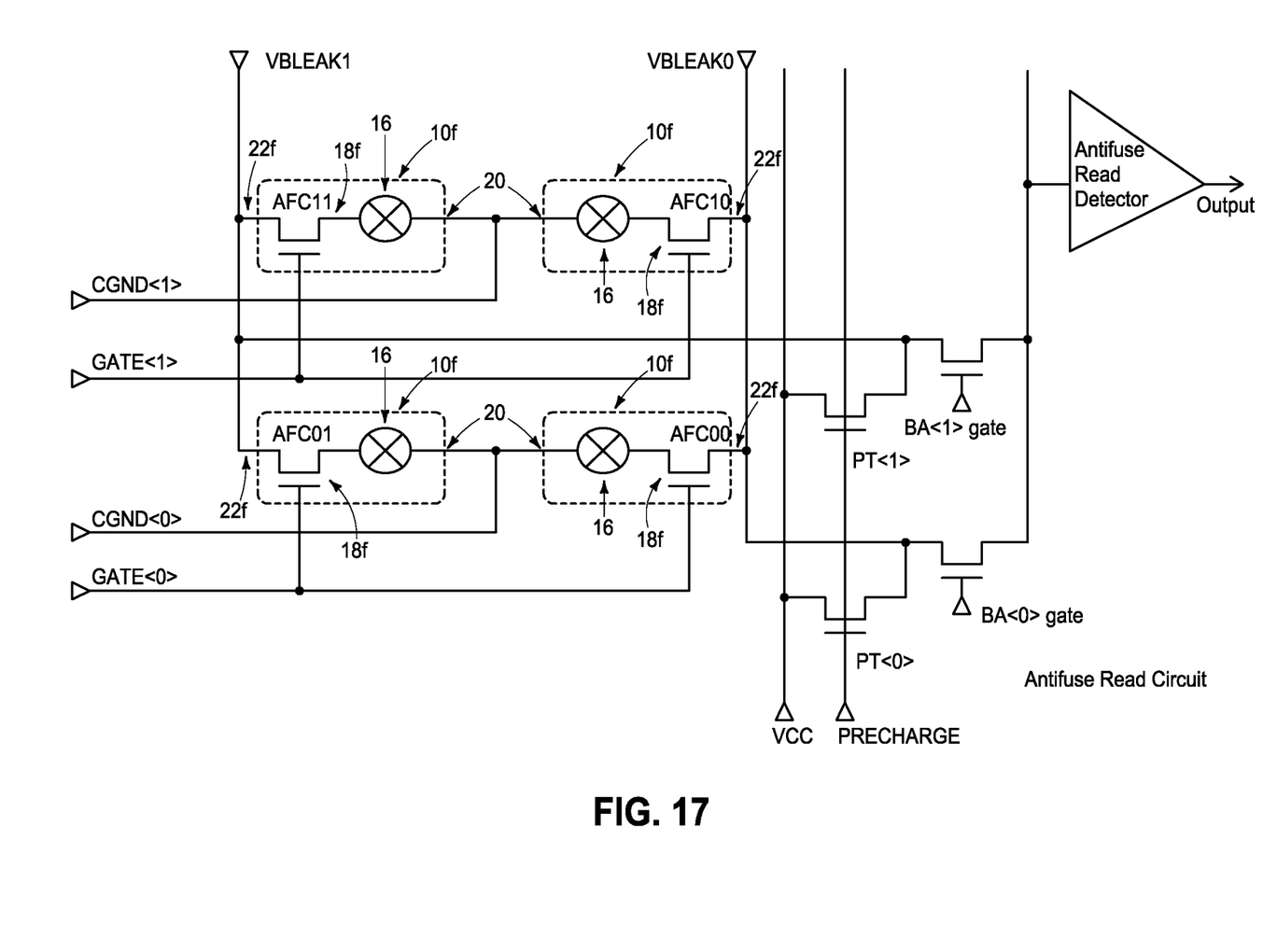
FIG. 17 is an enlargement of a portion of FIG. 16 as shown in FIG. 16 by a FIG. 17 dashed outline.

FIG. 16 is a hybrid schematic and construction view of a larger array than that shown by FIG. 15, and FIG. 17 is an enlargement of a portion of FIG. 16 as shown in FIG. 16 by a dashed outline. With respect to the FIGS. 16 and 17 array, programming (blowing an antifuse) may be attained by supplying an active level to a selected one of the gate control lines GATE<N> (e.g., a first control line) to turn ON the pass gate of a pass transistor 18f of a selected antifuse cell 10f, with the ground level supplied to a selected one of the ground control lines CGND<N> (e.g., a third control line) to ground the first node 20 of the selected antifuse cell, and a high voltage supplied to a selected one of the voltage control lines VBLEAK<N> (e.g., a second control line) to boost the voltage at second node 22f of the selected antifuse cell, wherein N is an integer from 0 to 15 in one embodiment. Thus, in the selected antifuse cell (AFC00, for example), the high voltage is applied to the antifuse gate/first antifuse electrode through the pass gate to destroy the insulator film under the antifuse gate/first antifuse electrode.

The state of each antifuse cell may be read out by use of an antifuse read circuit that includes sixteen gate transistors BA<N>, each of which is coupled between an associated one of the voltage control lines VBLEAK<N> and an input node of an antifuse read detector, and sixteen precharge transistors (PT,N>), each of which is coupled to an associated one of the voltage control lines VBLEAK<N> and a VCC voltage line. At first, each of the precharge transistors PT is turned ON to precharge each voltage control line VBLEAK to the VCC level. After turning each precharge transistor PT OFF, an active level is supplied to a selected one of the gate control lines GATE<N> to turn ON the pass gate of a selected antifuse cell, and the ground level is supplied to a selected one of the ground control lines CGND<N> to ground the first node 20 of the selected antifuse cell. For example, if the antifuse cell AFC00 is selected, the active level and the ground level are supplied respectively to the gate control line GATE<0> and the ground control line CGND<0>. If the antifuse element of the antifuse cell AFC00 is blown, a conductive path is formed between the voltage control line VBLEAK<0> and the ground to discharge the voltage control line VBLEAK<0> to the ground level. The transistor BA<0> is then turned ON to couple the voltage control line VBLEAK<0> to the antifuse read detector so that the antifuse read detector outputs, for example, the logic 0 due to the antifuse cell AFC00 being blown. If the AFC00 is not blown, on the other hand, the voltage control line VBLEAK<0> is kept precharged so that the antifuse read detector outputs, for example, the logic 1 due to the antifuse cell AFC00 not being blown.

Figures 13, 14:
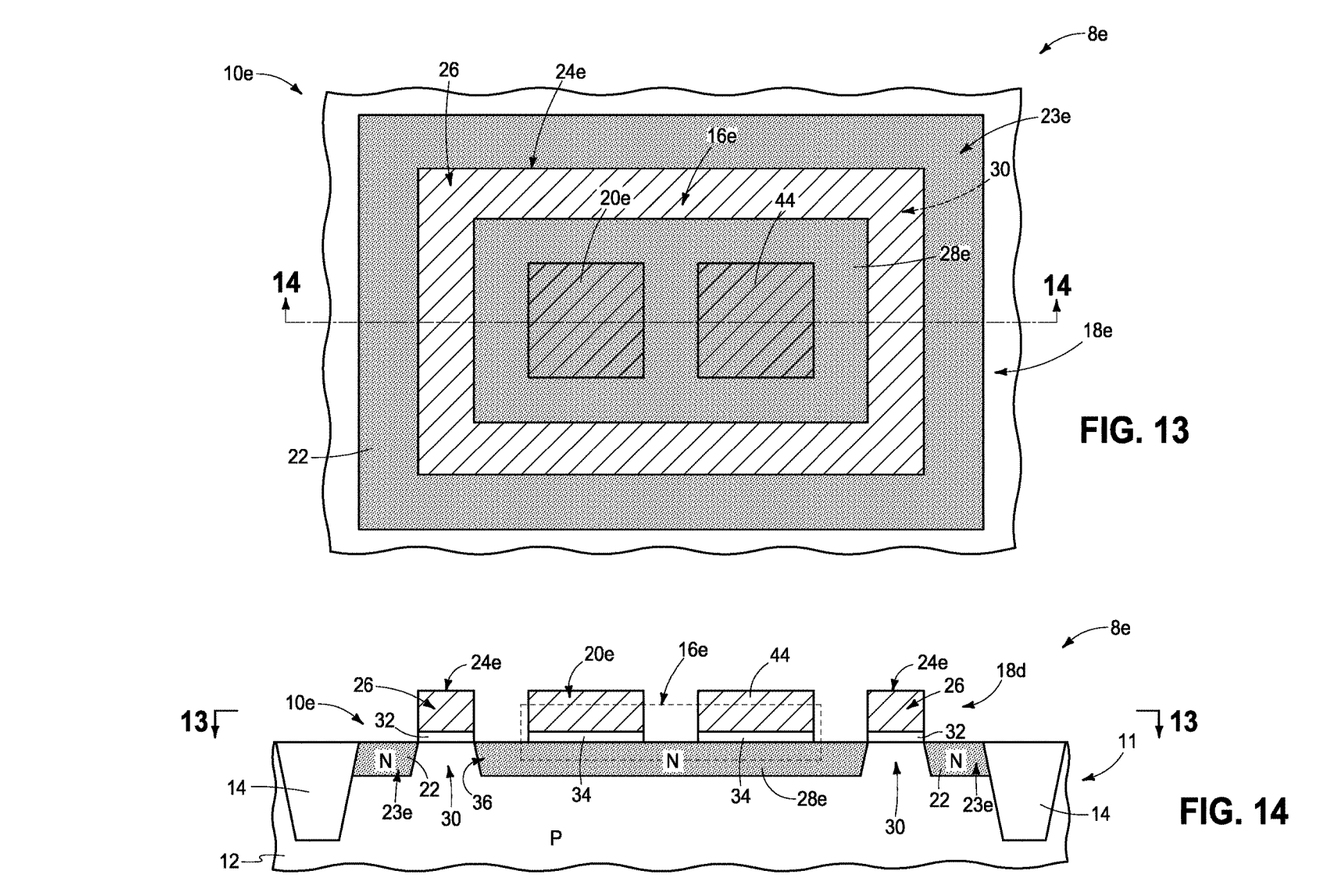
FIG. 13 is a diagrammatic horizontal cross-sectional and downward view of an apparatus in accordance with an embodiment of the invention, and is taken through line 13-13 in FIG. 14.
FIG. 14 is a cross-sectional view taken through line 14-14 in FIG. 13.

In one embodiment, two sets of the gate control lines GATE<N> and the ground control lines CGND<N> may be selected simultaneously in a reading operation to present the substantially the same effect as the antifuse construction of FIGS. 13 and 14. To this end, two antifuse cells (AFC00 and AFC88, for example) are accessed simultaneously during the reading operation. More specifically, two gate control lines GATE<0> and GATE<8> are supplied with the active level simultaneously to turn ON the pass gates of the antifuse cells AFC00 and AFC88 and two ground control lines CGND<0> and CGND<8> are supplied with the ground level to ground the first nodes 20*e* of both antifuse cells AFC00 and AFC88. The voltage control lines VBLEAK<0> and VBLEAK<8> are electrically wired-ORed at the input node of the antifuse read detector through the transistors BA<0> and BA<87>. Accordingly, so long as at least one of the antifuse cells AFC00 and AFC88 maintains a lowest resistivity state due to it being blown, the antifuse read detector outputs the logic 0. Of course prior to a reading operation, the antifuse cells AFC00 and AFC88 may be blown in sequence according to the programming operation as described before.

Figure 1:
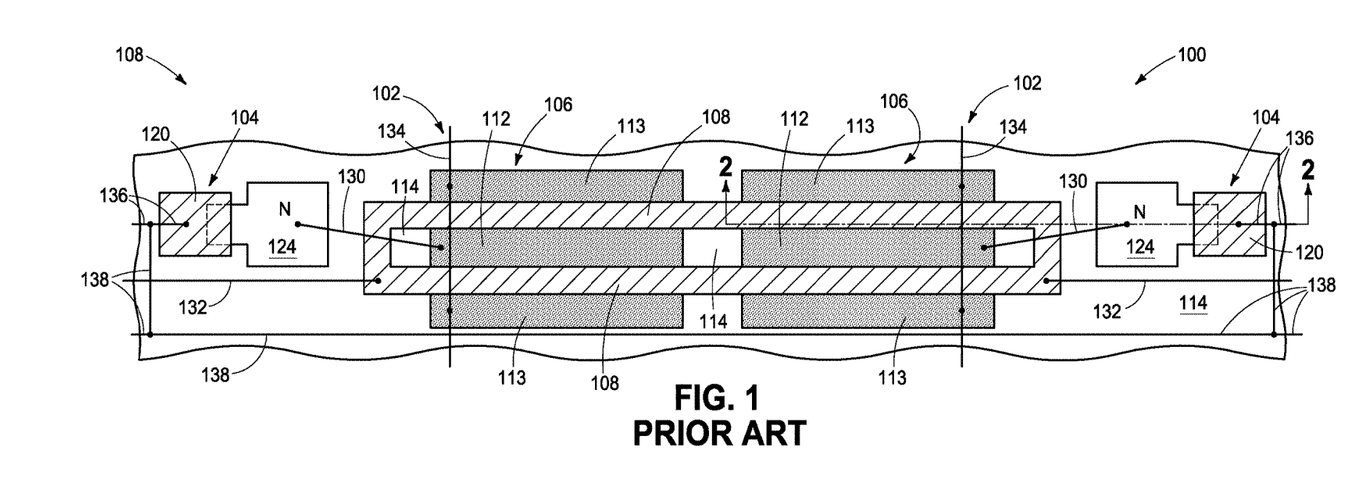
FIG. 1 is a diagrammatic horizontal cross-sectional view of a prior art apparatus.
Figure 2:
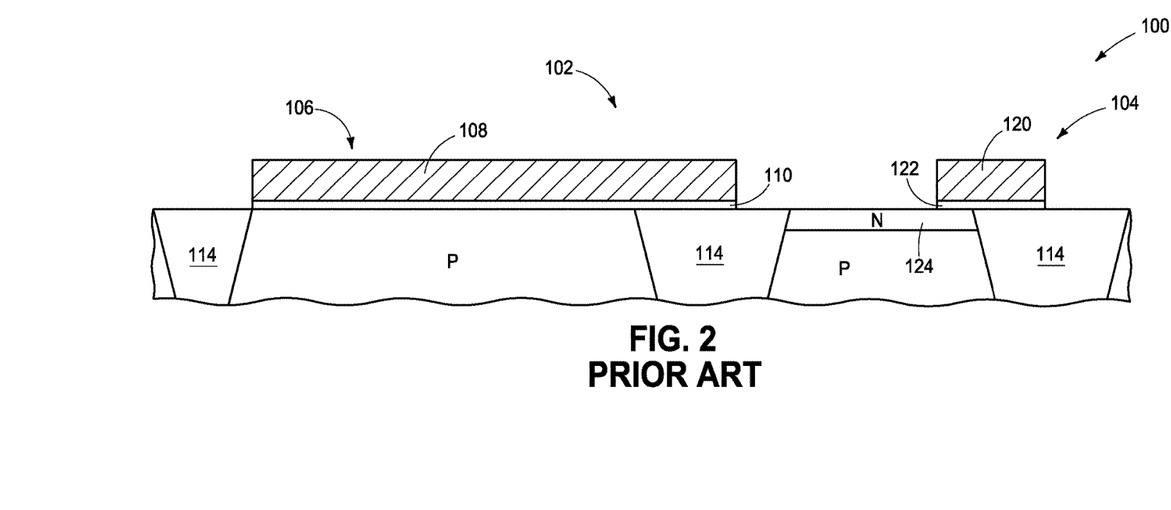
FIG. 2 is a cross-sectional view taken through line 2-2 in FIG. 1.

An embodiment as shown by FIGS. 15-17 may be advantageous over that of prior art FIGS. 1 and 2. For example, a separate interconnect line 130 between one antifuse electrode and a source/drain region of the pass transistor may be eliminated. Further in such instance, dead space under such an interconnect line can be eliminated. Additionally, some or all of remaining of the FIGS. 1 and 2 schematically-depicted interconnect lines that would be above gate 108 and antifuse electrode 120 may not be needed. Using the FIGS. 15 and 16 layout instead of one based on prior art FIGS. 1 and 2 may result in a saving of horizontal area occupied by antifuse cells (e.g., about 28%).

In one embodiment, an apparatus comprises an antifuse cell (e.g., 10, 10*a*, 10*b*, 10*c*, 10*d*, 10*e*, 10*f*) comprising an antifuse element (e.g., 16, 16*a*, 16*b*, 16*c*, 16*d*, 16*e*, 16*f*) comprising a first antifuse electrode (e.g., 20, 20*e*) and a second antifuse electrode (e.g., 28, 28*a*, 28*b*, 28*c*, 28*d*, 28*e*, 28*f*). A pass transistor (e.g., 18, 18*a*, 18*b*, 18*c*, 18*d*, 18*e*, 18*f*) comprises a first source/drain region (e.g., 28, 28*a*, 28*b*, 28*c*, 28*d*, 28*e*, 28*f*), a second source/drain region (e.g., 22, 22*f*), a channel region (e.g., 30) between the first source/drain region and the second source/drain region, and a pass gate (e.g., 24, 24*e*, 24*f*) operably proximate the channel region. At least one of (a), (b), (c), and (d) exists, where (a) is the pass gate comprises a substantially-annular structure substantially surrounding the first antifuse electrode in straight-line horizontal cross-section, (b) is the first source/drain region is substantially annular in straight-line horizontal cross-section, (c) is the second source/drain region is substantially annular in straight-line horizontal cross-section, and (d) is the second antifuse electrode and the first source/drain region are common to and shared by the antifuse element and the pass transistor. In one embodiment, the apparatus comprises at least two, in one embodiment at least three, and in one embodiment all four of the (a), (b), (c), and (d). Any other attribute(s) or aspect(s) as shown and/or described herein with respect to other embodiments may be used.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extending elevationally" refer to a direction that is angled away by at least 45° from exactly horizontal.

Further, "extend(ing) elevationally" and "elevationally-extending" with respect to a field effect transistor are with reference to orientation of the transistor's channel length along which current flows in operation between the source/drain regions. For bipolar junction transistors, "extend(ing) elevationally" and "elevationally-extending" are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

CONCLUSION

In some embodiments, an apparatus comprises an antifuse cell comprising first and second nodes, an antifuse element, and a transistor. The antifuse element and the transistor are coupled in series between the first and second nodes. The antifuse element comprises an antifuse gate. The transistor comprises a transistor gate comprising a substantially-annular structure substantially surrounding the antifuse gate.

In some embodiments, an apparatus comprises a pair of antifuse cells individually comprising first and second nodes, an antifuse element, and a transistor. The antifuse element and the transistor are coupled in series between the first and second nodes. The antifuse element comprises an antifuse gate and the transistor comprises a transistor gate. The transistor gates of the pair of antifuse cells comprise a first pair of gate lines running along first opposing sides of the individual antifuse gates and between the antifuse cells of the pair of antifuse cells. The first pair of gate lines directly electrically couples the two antifuse cells of the pair of antifuse cells together. A second pair of gate lines runs along second opposing sides of the individual antifuse gates and contacts each gate line of the first pair. The first pair and the second pair form two annular structures that individually completely surround one of the antifuse gates of the pair of antifuse cells.

In some embodiments, an apparatus comprises an antifuse cell comprising an antifuse element comprising a first antifuse electrode and a second antifuse electrode. A pass transistor comprises a first source/drain region, a second source/drain region, a channel region between the first source/drain region and the second source/drain region, and a pass gate operably proximate the channel region. At least one of (a), (b), (c), and (d) exists, where (a) is the pass gate comprises a substantially-annular structure substantially surrounding the first antifuse electrode in straight-line horizontal cross-section, (b) is the first source/drain region is substantially annular in straight-line horizontal cross-section, (c) is the second source/drain region is substantially annular in straight-line horizontal cross-section, and (d) is the second antifuse electrode and the first source/drain region are common to and shared by the antifuse element and the pass transistor.

In some embodiments, an apparatus comprises an antifuse cell comprising an antifuse element comprising a first antifuse electrode and a second antifuse electrode. A pass transistor comprises a first source/drain region, a second source/drain region, a channel region between the first source/drain region and the second source/drain region, and a pass gate operably proximate the channel region. The pass gate is on both of opposite lateral sides of the first antifuse electrode in both straight-line vertical cross-section and straight-line horizontal cross-section.

In some embodiments, an apparatus comprises an antifuse cell comprising an antifuse element comprising a first antifuse electrode and a second antifuse electrode. A pass transistor comprises a first source/drain region, a second source/drain region, a channel region between the first source/drain region and the second source/drain region, and a pass gate operably proximate the channel region. The second antifuse electrode and the first source/drain region are common to and shared by the antifuse element and the pass transistor. The pass gate is at least one of above and below the channel region laterally outward of the second antifuse electrode and the first second source/drain region in a straight-line vertical cross-section.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An apparatus comprising an antifuse cell, the antifuse cell comprising:
    first and second nodes;
    an antifuse element and a transistor, the antifuse element and the transistor being coupled in series between the first and second nodes;
    the antifuse element comprising an antifuse gate;
    the transistor comprising a transistor gate, the transistor gate comprising a substantially-annular structure substantially surrounding the antifuse gate;
    the transistor comprising a first source/drain diffusion region inside the substantially-annular structure of the transistor gate and a second source/drain diffusion region outside the substantially-annular structure of the transistor gate; and
    at least a part of the antifuse gate overlapping at least a part of the first source/drain diffusion region with an intervention of gate insulator material.

2. The apparatus of claim 1 wherein all of the antifuse gate overlaps at least a part of the first source/drain diffusion region.

3. The apparatus of claim 1 further comprising:
    a first control line coupled to the transistor gate;
    a second control line coupled to the second node; and
    a third control line coupled to the first node, the first node being coupled to the antifuse gate.

4. An apparatus comprising an antifuse cell, the antifuse cell comprising:
    an antifuse element comprising a first antifuse electrode and a second antifuse electrode;
    a pass transistor comprising a first source/drain region, a second source/drain region, a channel region between the first source/drain region and the second source/drain region, and a pass gate operably proximate the channel region; and
    the pass gate being on both of opposite lateral sides of the first antifuse electrode in both straight-line vertical cross-section and straight-line horizontal cross-section, the first antifuse electrode and the second antifuse electrode being laterally spaced from the pass gate.

* * * * *